(12) United States Patent
Lee et al.

(10) Patent No.: US 10,714,508 B2
(45) Date of Patent: Jul. 14, 2020

(54) DISPLAY DEVICE

(71) Applicant: SAMSUNG DISPLAY CO., LTD., Yongin-si, Gyeonggi-do (KR)

(72) Inventors: Seung-Kyu Lee, Asan-si (KR); Tae Hoon Kwon, Yongin-si (KR); Ji-Hyun Ka, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/527,382

(22) Filed: Jul. 31, 2019

(65) Prior Publication Data

US 2019/0355755 A1 Nov. 21, 2019

Related U.S. Application Data

(63) Continuation of application No. 15/939,870, filed on Mar. 29, 2018, now Pat. No. 10,411,042, which is a (Continued)

(30) Foreign Application Priority Data

Sep. 14, 2015 (KR) ........................ 10-2015-0129682

(51) Int. Cl.
*H01L 27/12* (2006.01)
*G02F 1/1345* (2006.01)
(Continued)

(52) U.S. Cl.
CPC .......... *H01L 27/124* (2013.01); *G02F 1/1345* (2013.01); *G02F 1/13458* (2013.01);
(Continued)

(58) Field of Classification Search
CPC ............... G02F 1/1345; G02F 1/13458; G02F 1/136286; G02F 2001/13629;
(Continued)

(56) References Cited

U.S. PATENT DOCUMENTS 9,947,692 B2 4/2018 Lee et al.
2008/0203391 A1 8/2008 Kim et al.
(Continued)

FOREIGN PATENT DOCUMENTS

KR 100961268 5/2010
KR 1020100121893 11/2010
(Continued)

OTHER PUBLICATIONS

European Search Report dated Feb. 1, 2017 in Co-Pending European Patent Application No. 16187911.9.

*Primary Examiner* — Long K Tran
(74) *Attorney, Agent, or Firm* — F. Chau & Associates, LLC

(57) ABSTRACT

Disclosed is a display device including: a substrate including a display area for displaying an image and a peripheral area neighboring the display area; a plurality of signal lines formed in the display area; a pad formed in the peripheral area; and a plurality of connection wires for connecting the signal lines and the pad, wherein a first connection wire and a second connection wire neighboring the first connection wire from among the plurality of connection wires are disposed on different layers, and the first connection wire and the second connection wire, which are formed to extend from the pad and are bent at least twice to have at least one being bent toward backward direction, are disposed in the peripheral area.

20 Claims, 13 Drawing Sheets

Related U.S. Application Data continuation of application No. 15/161,774, filed on May 23, 2016, now Pat. No. 9,947,692.

(51) Int. Cl.
*G02F 1/1362* (2006.01)
*G09G 3/36* (2006.01)

(52) U.S. Cl.
CPC ......... *G02F 1/136286* (2013.01); *G09G 3/36* (2013.01); *G09G 3/3648* (2013.01); *H01L 27/1218* (2013.01); *H01L 27/1244* (2013.01); *H01L 27/1248* (2013.01); *G02F 2001/13629* (2013.01); *G09G 2300/0408* (2013.01); *G09G 2300/0426* (2013.01); *G09G 2320/0209* (2013.01); *G09G 2320/0223* (2013.01)

(58) Field of Classification Search
CPC ............... H01L 27/1218; H01L 27/124; H01L 27/1244; H01L 27/1248

USPC ........................................................ 257/773
See application file for complete search history.

(56) References Cited

U.S. PATENT DOCUMENTS

| | | |
|---|---|---|
| 2010/0025690 A1 | 2/2010 | Kim et al. |
| 2010/0155729 A1 | 6/2010 | Yang et al. |
| 2014/0022148 A1 | 1/2014 | Kim et al. |
| 2015/0173232 A1 | 6/2015 | Chai |
| 2017/0077143 A1 | 3/2017 | Lee et al. |
| 2018/0226430 A1 | 8/2018 | Lee et al. |

FOREIGN PATENT DOCUMENTS

| | | |
|---|---|---|
| KR | 1020140045192 | 4/2014 |
| KR | 101514768 | 4/2015 |

DISPLAY DEVICE

CROSS-REFERENCE TO RELATED APPLICATION

This application is a continuation of U.S. application Ser. No. 15/161,774 filed on May 23, 2016, now U.S. Pat. No. 9,947,692, issued Apr. 17, 2018, which claims priority under 35 U.S.C. § 119 to Korean Patent Application No. 10-2015-0129682 filed in the Korean Intellectual Property Office on Sep. 14, 2015, the entire contents of which are incorporated by reference herein in their entirety.

BACKGROUND OF THE INVENTION

(a) Technical Field

The present invention relates to a display device

(b) Discussion of the Related Art

Currently known display devices include a liquid crystal display (LCD), a plasma display panel (PDP), an organic light emitting diode (OLED) device, a field effect display (FED), and an electrophoretic display device.

In particular, the OLED device of the above known display devices includes two electrodes and an organic emission layer positioned between the two electrodes; an electron injected from one electrode and a hole injected from the other electrode are coupled with each other in the organic emission layer to generate an exciton; and the exciton emits energy to emit light.

Since the OLED device has a self-luminance characteristic and does not require a separate light source, unlike an LCD, its thickness and weight may be reduced. Further, since the OLED device has superior characteristics, such as low power consumption, high luminance, and a high response speed, the OLED device has gained attention as a next-generation display device.

To drive an organic light emitting element of the organic light emitting device, a fan out unit for connecting a gate line (or a data line) and a gate IC (or a data IC) is formed in a peripheral area of a substrate. However, connection wires formed on the fan out unit may have different lengths so as to have different resistances, thereby delaying signals transmitted through the connection wires.

SUMMARY OF THE INVENTION

The present invention has been made to provide a display device for minimizing differences in the length of connection wires of a fan out unit.

According to an exemplary embodiment of the present invention, there is provided a display device including: a substrate including a display area for displaying an image and a peripheral area neighboring the display area; a plurality of signal lines formed in the display area; a pad formed in the peripheral area; and a plurality of connection wires for connecting the signal lines and the pad, wherein a first connection wire and a second connection wire neighboring the first connection wire from among the plurality of connection wires are disposed on different layers, and the first connection wire and the second connection wire are disposed in the peripheral area in a shape so that they extend to the display area from the pad and bend at least twice to have at least one being bent toward backward direction.

The first and second connection wires may be disposed separately from each other with a predetermined gap.

The first connection wire and the second connection wire each may include: a first connector connected to the pad and a second connector connected to the signal line; and an extension connected between the first and second connectors, the extension including a plurality of first bridges disposed parallel to the first connector and a plurality of second bridges forming a predetermined angle with the first bridges, and the first bridges and the second bridges being alternately connected.

The adjacent first and second bridges may be vertical to each other.

The first bridges may be disposed parallel to each other.

The neighboring first bridges from among the first bridges may be formed to have the same length.

The second bridges may be disposed parallel to each other.

The second bridges may be formed to have different lengths.

The second bridges may be formed to have the same length.

The first bridges may be longer than the second bridges.

The second connector may be bent.

Extension of the first connection wire and extension of the second connection wire neighboring the first connection wire may be rotated by 180 degrees and may be symmetrical with each other.

Neighboring edges of the first and second connection wires may overlap each other.

The pad may include a plurality of connecting pad terminals connected to the connection wires and a plurality of dummy pad terminals not connected to the connection wires.

The first and second connection wires may be connected to the connecting pad terminal.

The display device may further include a flexible film that is connected to the pad and that includes a first side on which a first driving chip is provided.

The display device may further include a second driving chip formed in the peripheral area and connected to the pad.

An insulating layer may be provided between the first and second connection wires.

Signal lines connected to the first and second connection wires from among the signal lines may be formed on different layers.

The connection wires may be formed to be double layers, triple layers, or quadruple layers.

The signal lines may be gate lines.

The signal lines may be data lines.

In an exemplary embodiment of the present invention, there is provided a display device including: a substrate having a display panel and a pad; a plurality of signal lines formed in the display panel; a plurality of connecting pad terminals formed in the pad; and a plurality of connection wires formed on the substrate for connecting the signal lines and the connecting pad terminals, wherein a first connection wire and a second connection wire neighboring the first connection wire from among the plurality of connection wires are disposed and separated from each other with a predetermined gap on different layers, and the first connection wire and the second connection wire having a same length, which are shaped to extend to the display panel from the pad and are bent at least twice to have at least one being bent toward backward direction.

In the display device according to an exemplary embodiment of the present invention, the transmission of signals is prevented from being delayed by allowing the connection wires of the fan out unit to have the same length.

Further, adjacent connection wires are disposed on different layers to minimize the gap among the connection wires and thereby increase the integrity of the connection wires.

In addition, adjacent connection wires are disposed on different layers to prevent the connection wires from being short-circuited by a foreign particle.

BRIEF DESCRIPTION OF THE DRAWINGS

Exemplary embodiments of the inventive concept may best be understood from the following detailed description of preferred embodiments, taken in conjunction with the appended drawings, and in which.

Figure 1:
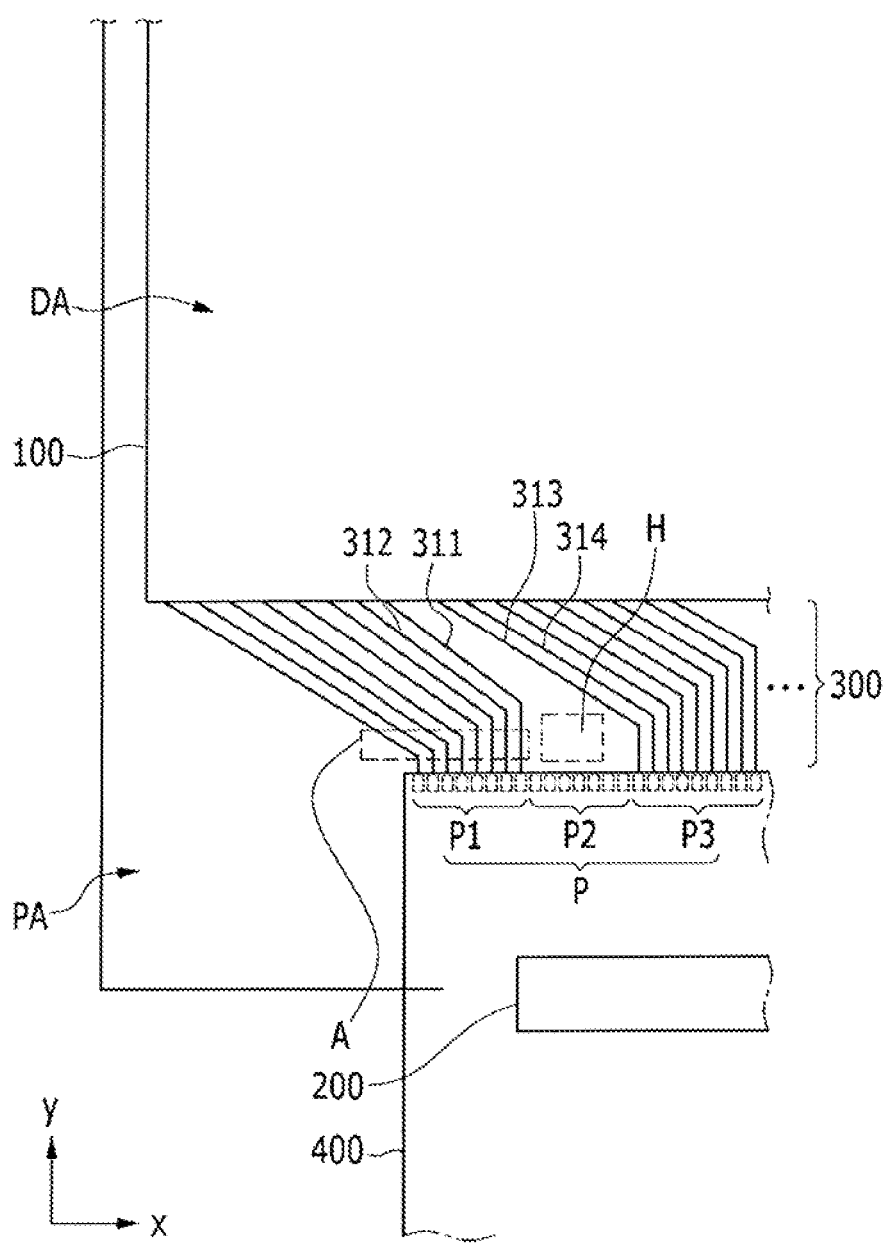
FIG. 1 shows a partial top plan view of a display device including connection wires according to a first exemplary embodiment of the inventive concept.

Since the drawings in FIGS. 1-13 are intended for illustrative purpose, the elements in the drawings are not necessarily drawn to scale. For example, some of the elements may be enlarged or exaggerated for clarity purpose.

DETAILED DESCRIPTION OF THE EMBODIMENTS

In the following detailed description, only certain exemplary embodiments of the inventive concept have been shown and described, simply by way of illustration. As those skilled in the art would realize, the described exemplary embodiments may be modified in various different ways, all without departing from the spirit or scope. The drawings and description are to be regarded as illustrative in nature and not restrictive. Like reference numerals designate like elements throughout the specification.

The size and thickness of each component illustrated in the drawings are arbitrarily illustrated in the drawings for better understanding and ease of description, but the present invention is not limited to the illustrations.

It will be understood that when an element, for example, a layer, film, region, or substrate is referred to as being "on" another element, it can be directly on the other element or intervening elements may also be present. In addition, throughout the specification, unless explicitly described to the contrary, the word "comprise" and variations, for example, "comprises" or "comprising" will be understood to imply the inclusion of stated elements but not the exclusion of any other elements. It is understood that the term "on" and similar terms are used generally and are not necessarily related to a gravitational reference.

A display device including connection wires according to a first exemplary embodiment of the inventive concept will now be described with reference to FIG. 1 to FIG. 6.

Figure 2:
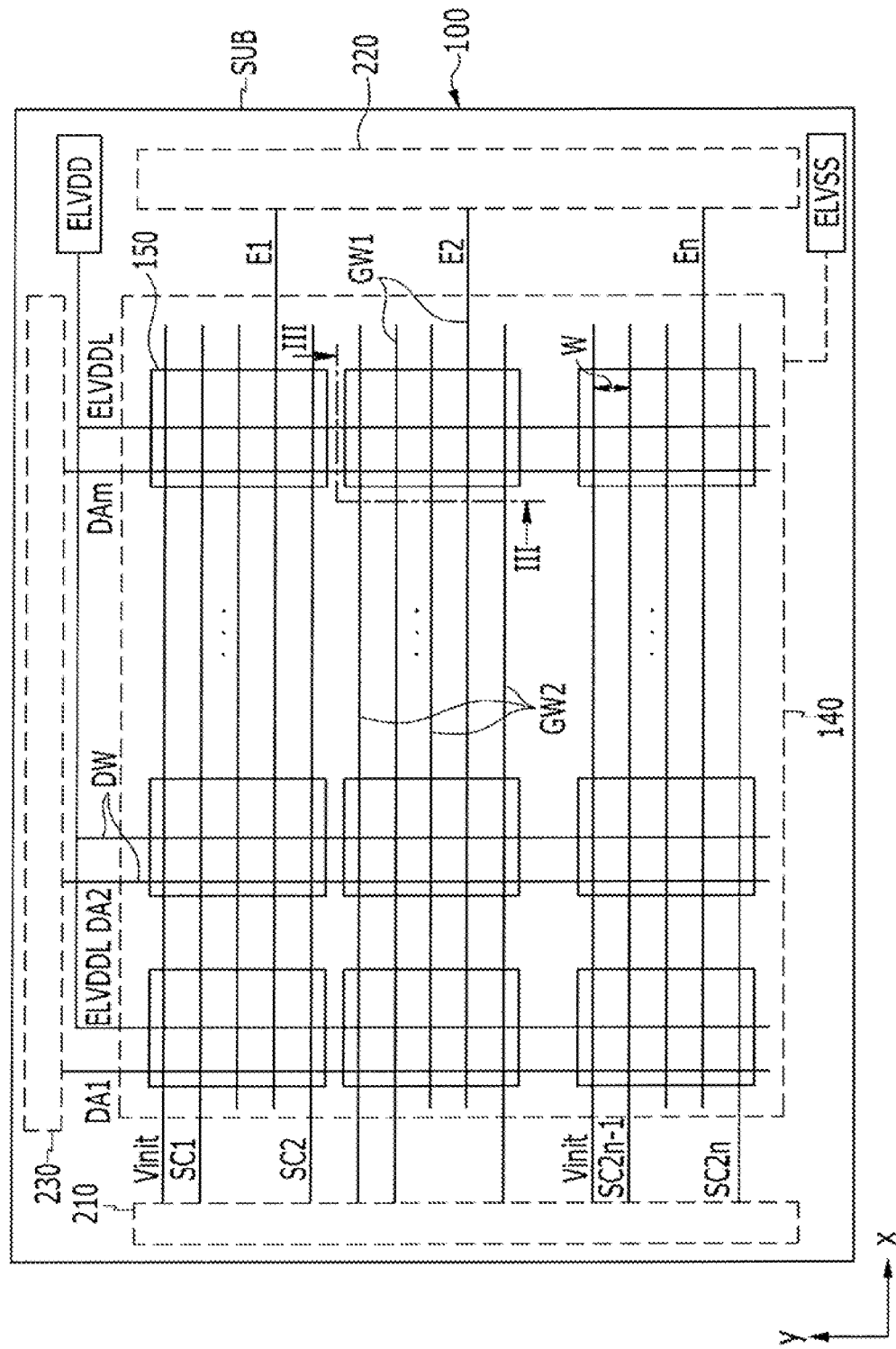
FIG. 2 shows a display area of FIG. 1 according to an exemplary embodiment of the inventive concept.
Figure 3:
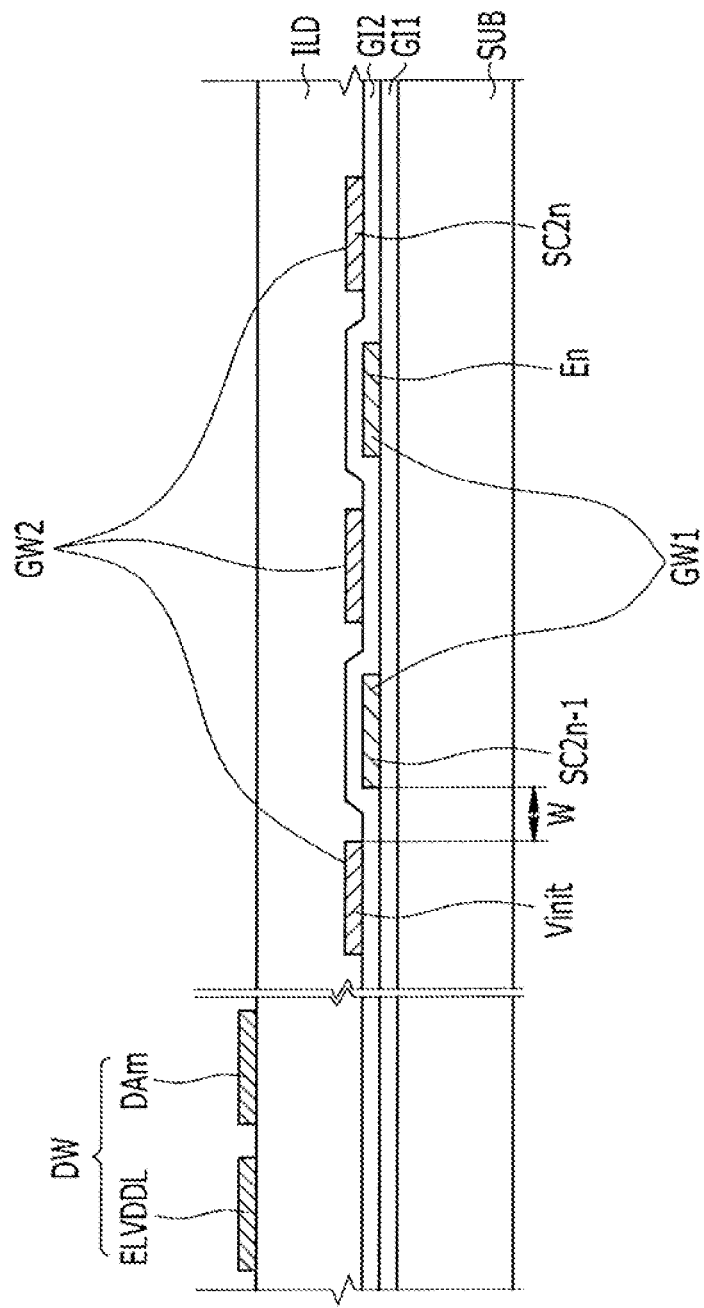
FIG. 3 shows a cross-sectional view with respect to line III-III of FIG. 2 according to an exemplary embodiment of the inventive concept.

FIG. 1 shows a partial top plan view of a display device including connection wires according to a first exemplary embodiment of the inventive concept, FIG. 2 shows a display area of FIG. 1, and FIG. 3 shows a cross-sectional view with respect to line III-III of FIG. 2.

Referring to FIG. 1 to FIG. 3, the display device includes a substrate (SUB), a display panel 100, a pad (P), a flexible film 400, and a plurality of connection wires 300.

Figure 4:
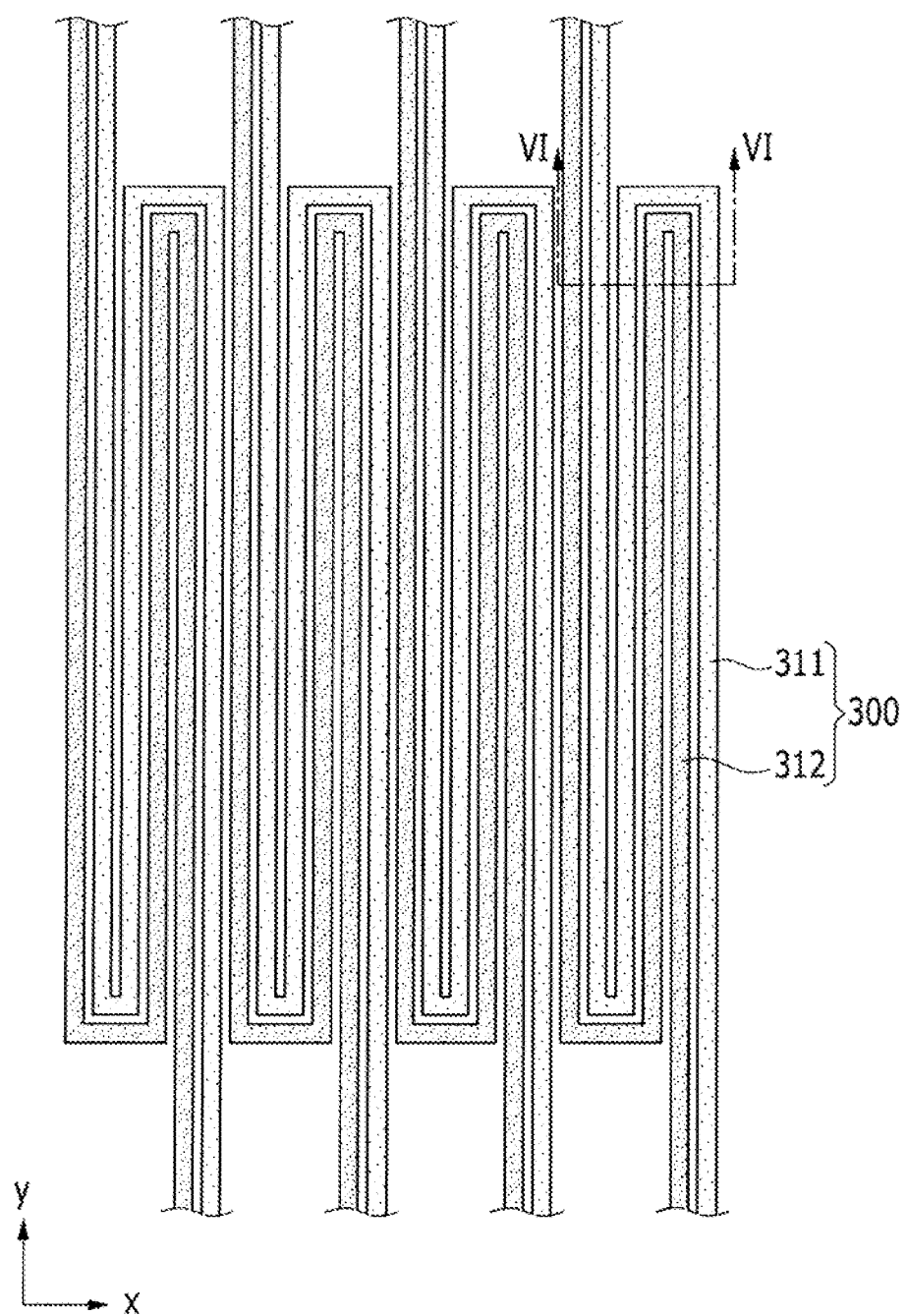
FIG. 4 shows an enlarged view of connection wires in region A of FIG. 1 according to a first exemplary embodiment of the inventive concept.

From among a plurality of connection wires 300 for connecting the display panel 100 and the pad (P), first and second connection wires 311 and 312 that are adjacent to each other are formed on different layers, are separated from each other with a predetermined gap, and are disposed parallel to each other. FIG. 4 shows an enlarged view of connection wires in region A of FIG. 1. As shown in FIG. 4, the first and second connection wires 311 and 312 include a section extended to the display panel 100 from the pad (P) in a second direction, in which these connection wires are extended to the display panel 100 in a forward direction, bent to extend toward the pad (P) in a backward direction, and then bent to extend to the display panel 100. An X axis represents the first direction and a Y axis indicates the second direction. The first and second connection wires 311 and 312 are bent at least twice, and these wires are bent toward backward direction at least once.

Referring to FIG. 1, the substrate (SUB) is divided into a display area (DA) for displaying an image and a peripheral area (PA) neighboring the display area (DA). A display panel 100 for emitting light may be provided in the display area (DA). A plurality of connection wires 300, a pad (P), and a flexible film 400 for driving the display panel 100 may be provided in the peripheral area (PA). The above-described components provided on the substrate (SUB) will be described further.

Referring to FIG. 2 and FIG. 3, the display panel 100 formed in the display area (DA) of the substrate (SUB), includes first gate wires (GW1), second gate wires (GW2), data wires (DW), a display unit 140, and a pixel 150.

In response to a control signal supplied by an external control circuit (e.g., a timing controller), the gate driver 210 sequentially supplies scan signals to first scan lines (SC2-SC2n) or second scan lines (SC1-SC2n−1) included in the first gate wires GW1 or the second gate wires GW2. The pixel 150 is selected by the scan signal and sequentially receives a data signal. The gate driver 210 shown in FIG. 2 is formed in a first driving chip 200 on a flexible film 400, and it is shown in FIG. 2 for convenience of description.

The first gate wires GW1 as shown in FIG. 3 are provided on the substrate (SUB) with a first insulating layer GI1 therebetween, and are extended in a first direction. The first gate wires GW1 include a second scan line (SC2n−1) and emission control line (E1-En). The second scan line (SC2n−1) is connected to a gate driver 210 and receives a scan signal from the gate driver 210. An emission control line (En) is connected to an emission control driver 220 and receives an emission control signal from the emission control driver 220. In a like manner as the gate driver 210, the emission control driver 220 shown in FIG. 2 is formed in the first driving chip 200 on the flexible film 400 and is shown in FIG. 2 for ease of description.

The second gate wires GW2 are provided on the first gate wires GW1 with a second insulating layer GI2 therebetween, and are extended in the first direction. The second gate wires GW2 include a first scan line (SC2n) and an initialization power line (Vinit). The first gate wires GW1 do not overlap the second gate wires GW2.

The first scan line (SC2n) is connected to the gate driver 210 and receives a scan signal from the gate driver 210. The initialization power line (Vinit) is connected to the gate driver 210 and receives initialization power from the gate driver 210.

In an exemplary embodiment of the inventive concept, the initialization power line (Vinit) receives the initialization power from the gate driver 210, and it may be connected to another additional component and may receive initialization power from the additional component.

The emission control driver 220 sequentially supplies an emission control signal to the emission control line (En) corresponding to a control signal supplied by an external component such as a timing controller. The pixel 150 undergoes emission control by the emission control signal. That is, the emission control signal controls an emission time of the pixel 150. The emission control driver 220 may be omitted depending on a configuration of the pixel 150.

The data driver 230 supplies a data signal to a data line (DAm) from among the data wires (DW) corresponding to a control signal supplied by an external component such as a timing controller. The data signal provided to the data line (DAm) is supplied to the pixel 150 selected by a scan signal each time when the scan signal is supplied to the first scan line (SC2n) or the second scan line (SC2n−1). The pixel 150 charges a voltage corresponding to the data signal and emits light with a corresponding luminance. In a like manner as the gate driver 210, the data driver 230 shown in FIG. 2 is formed in the first driving chip 200 on the flexible film 400, and is shown in FIG. 2 for convenience of description.

The data wires (DW) are provided on the second gate wires GW2 with a third insulating layer (ILD) therebetween, and are extended in the second direction crossing the first direction. The data wires (DW) include data lines (DA1-DAm) and a driving power line (ELVDDL). The data line (DAm) is connected to the data driver 230 and receives a data signal from the data driver 230. The driving power line (ELVDDL) is connected to a first power source (ELVDD) and receives driving power from the first power source (ELVDD).

The driving power line (ELVDDL) and the data line (DAm) may be formed on the same layer on the third insulating layer (ILD). The driving power line (ELVDDL) and the data line (DAm) may also be formed on different layers. For example, the driving power line (ELVDDL) may be formed on the same layer as the first gate wire GW1, and the data line (DAm) may be formed on the same layer as the second gate wire GW2. On the contrary, the driving power line (ELVDDL) may be formed on the same layer as the second gate wire GW2, the data line (DAm) may be formed on the same layer as the first gate wire GW1, and the display unit 140 includes a plurality of pixels 150 provided in crossing regions of the first gate wires GW1, the second gate wires GW2, and the data wires (DW). The pixel 150 includes an organic light emitting element for emitting light with luminance corresponding to a driving current that corresponds to the data signal, and a pixel circuit for controlling the driving current flowing to the organic light emitting element. The pixel circuit is connected to the first gate wires GW1, the second gate wires GW2, and the data wires (DW), and the organic light emitting element is connected to the pixel circuit. The pixel 150 is not limited to contain the organic light emitting element, for example, it may contain a liquid crystal display element or an electrophoretic display element.

The organic light emitting element of the display unit 140 is connected to an external first power source (ELVDD) with a pixel circuit therebetween, and a second power source (ELVSS). The first power source (ELVDD) and the second power source (ELVSS) supply driving power and common power respectively to the pixel 150 of the display unit 140, and the pixel 150 responds to the data signal according to the driving power and the common power provided to the pixel 150 by emitting light with luminance corresponding to the driving current passing through the organic light emitting element from the first power source (ELVDD).

According to an exemplary embodiment of the inventive concept, the gate wires that traverse the pixel 150 in the first direction and do not overlap each other, that is, the first gate wires GW1 including a second scan line (SC2n−1) and an emission control line (En) and the second gate wires GW2 including a first scan line (SC2n) and an initialization power line (Vinit) are not provided on the same layer, but the gate wires that are the first gate wires GW1 and the second gate wires GW2 are provided on different layers with a second insulating layer GI2 therebetween so that the distance (W) between the neighboring gate wires provided on the different layers may be formed to be narrow and more pixels 150 may be formed in the same area. Thus, a high-resolution display device may be formed.

Referring to FIG. 1 and FIG. 2, a plurality of connection wires 300 connect a plurality of signal lines, including a data line (DAm) and a scan line (SCn) of the display panel 100 to the pad (P). Here, the connection wires 300 correspond to the fan out unit in the display device for connecting the gate line or the data line to the gate IC or the data IC.

According to the first exemplary embodiment of the inventive concept, part of a plurality of connection wires 300 includes a section extended to the display panel 100 from the pad (P) in the second direction, in which these connection wires are extended to the display panel 100 in a forward direction, bent and extended toward the pad (P) in a backward direction, and then bent and extended to the display panel 100, so as to increase resistance of the connection wires. The plurality of connection wires 300 are bent at least twice, and these wires are bent toward backward direction at least once. For example, the connection wires may include a section formed by rotating the letter S by 90 degrees.

As shown in FIG. 1, a plurality of connection wires 300 connected to the display panel 100 are divided and connected to the connecting pad terminals P1 and P3 of two regions. That is, some of the connection wires are connected to the connecting pad terminal P1 and the rest of the connection wires are connected to the connecting pad terminal P3. A dummy pad terminal P2 may be provided between the connecting pad terminals P1 and P3. That is, no connection wire is connected to the dummy pad terminal P2.

A region through which a portable terminal, for example a camera module for a smartphone or a tablet PC passes, may be provided in a region through which the connection wire 300 passes. That is, the camera module may pass through a hole (H) of FIG. 1. As such, the connection wire is not connected to the dummy pad terminal P2. Accordingly, the hole is provided between the connection wires 311 and 313, which neighbor each other, and lengths of the connection wires 311 and 313 become different. When the signal is transmitted through the connection wires 311 and 313, resistance values are different from each other, thus signals may not simultaneously reach the display panel 100.

In the first exemplary embodiment of the inventive concept, to solve the above problem, for the purpose of increasing resistance of the short connection wire, part of a plurality of connection wires 300 includes a section extended to the display panel 100 from the pad (P) in the second direction, in which the connection wires 300 are extended to the display panel 100 in a forward direction, bent and extended toward the pad (P) in a backward direction, and then bent and extended to the display panel 100. The connection wires 300 are bent at least twice, and these wires are bent toward backward direction at least once.

Figure 5:
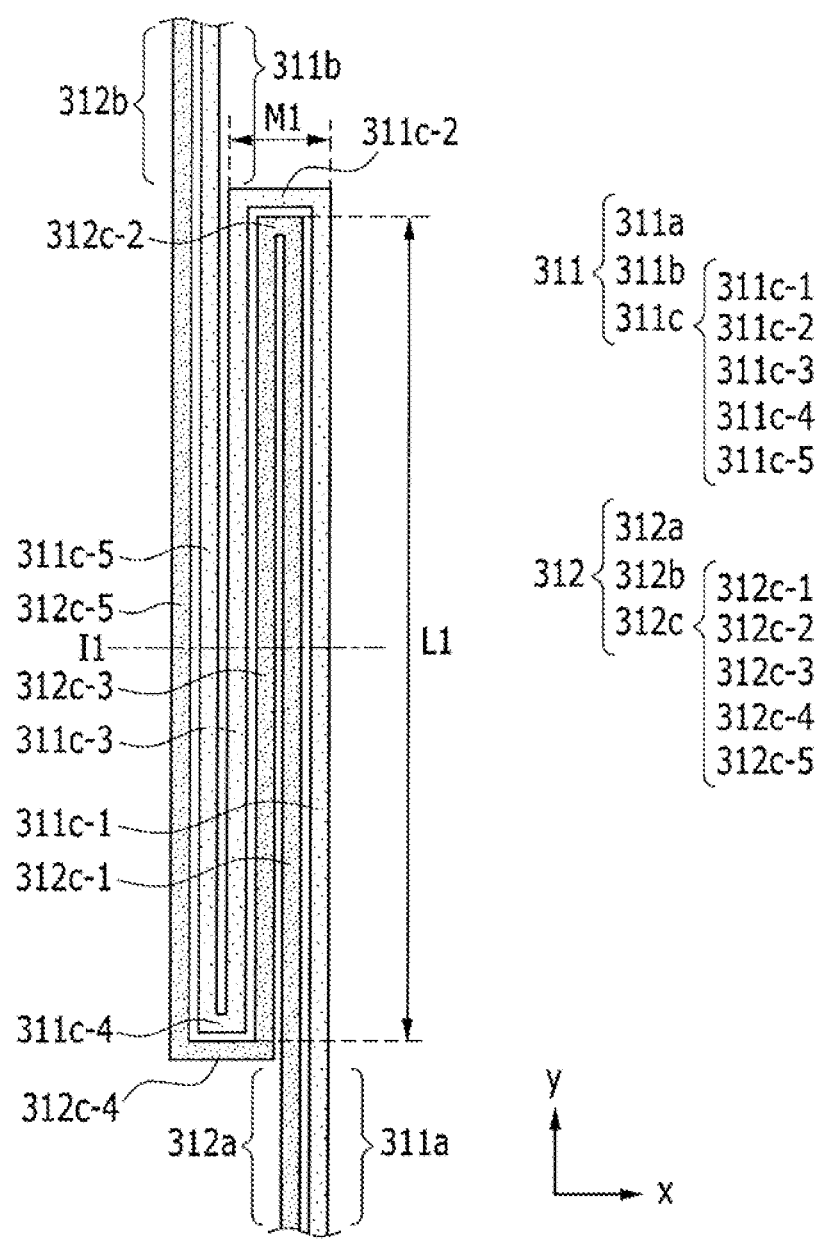
FIG. 5 shows first and second connection wires of FIG. 4 according to an exemplary embodiment of the inventive concept.

In detail, the neighboring first and second connection wires 311 and 312 from among a plurality of connection wires 300 respectively include first connectors 311a and 312a, second connectors 311b and 312b, and extensions 311c and 312c. Referring to FIG. 5, the first connection wire 311 includes a first connector 311a, a second connector 311b, and an extension 311c.

The first connector 311a is connected to a pad (P). The first connector 311a is extended and formed in the second direction. That is, the first connector 311a is formed to extend to the display panel 100 from the pad (P). As shown in FIG. 1 and FIG. 5, the first connector 311a may be formed in a linear manner in the second direction.

The second connector 311b is connected to the display panel 100 and is connected to the first connector 311a through the extension 311c. The second connector 311b is formed to be bent and then connected to a signal line of the display panel 100.

The extension 311c is connected between the first and second connectors 311a and 311b to increase resistance of the first connection wire 311. The extension 311c increases the length of the connection wire to increase resistance of the wire. Here, the extension 311c corresponds to the section formed by rotating the letter S by 90 degrees.

In detail, the extension 311c includes a plurality of first bridges (311c-1, 311c-3, 311c-5) and a plurality of second bridges (311c-2, 311c-4). The first bridges (311c-1, 311c-3, and 311c-5) are disposed parallel to the first connector 311a, and the second bridges (311c-2 and 311c-4) are disposed to be vertical to the first bridges (311c-1, 311c-3, and 311c-5). The plurality of second bridges may form a predetermined angle with the first bridges, in which the predetermined angle is 90 degrees or not 90 degrees. For example, one first bridge may form an angle smaller than 90 degrees with one second bridge, then this second bridge may form an angle larger than 90 degrees with the next first bridge.

The first bridges (311c-1, 311c-3, and 311c-5) and the second bridges (311c-2, 311c-4) are alternately connected to each other. When the first bridges (311c-1, 311c-3, and 311c-5) and the second bridges (311c-2 and 311c-4) are alternately connected, as shown in FIG. 5, the extension 311c may be disposed in a like manner as the letter S is rotated by 90 degrees. That is, the first bridge (311c-1), the second bridge (311c-2), the first bridge (311c-3), the second bridge (311c-4), and the first bridge (311c-5) are sequentially disposed so that they may be disposed according to the above-noted shape.

The first bridge (311c-1) is connected to the first connector 311a, and is disposed along the same direction as the first connector 311a. As such, the first connection wire 311 is extended to the display panel 100 from the pad (P) and a section going backward is formed in the extension 311c. Here, the backward section represents a section extended to the display panel 100 from the pad (P) in the second direction on the first connection wire 311, in which the connection wire 311 is extended to the display panel 100 in a forward direction, bent and extended toward the pad (P) in a backward direction in the backward section, and then bent and extended to the display panel 100. The connection wire 311 is bent at least twice, and the wire is bent toward backward direction at least once.

The first bridges (311c-1, 311c-3, and 311c-5) are disposed parallel to each other. That is, the first bridges (311c-1, 311c-3, and 311c-5) are disposed parallel to the first connector 311a. The neighboring first bridges (311c-3 and 311c-5) may be formed to have the same length.

The second bridges (311c-2 and 311c-4) are disposed parallel to each other. That is, the second bridges (311c-2 and 311c-4) are disposed parallel to be vertical to the first connector 311a. The second bridges (311c-2 and 311c-4) may be formed to have different lengths.

The second connection wire 312 includes a first connector 312a, a second connector 312b, and an extension 312c.

The first connector 312a is connected to the pad (P) in a like manner as the first connector 311a of the first connection wire 311. In this case, the first connector 312a is extended in the second direction. That is, the first connector 312a is extended to the display panel 100 from the pad (P). The first connector 312a may be formed in a linear manner in the second direction.

The second connector 312b is connected to the display panel 100 and is connected to the first connector 312a through the extension 312c. The second connector 312b may be bent and be connected to the signal line of the display panel 100.

The extension 312c is connected between the first and second connectors 312a and 312b and may increase resistance of the second connection wire 312. The extension 312c increases the length of the connection wire to increase resistance of the wire.

To increase the length of the connection wire, the extension 312c is formed with a section configured by rotating the letter S by 90 degrees.

In detail, the extension 312c includes a plurality of first bridges (312c-1, 312c-3, and 312c-5) and a plurality of second bridges (312c-2 and 312c-4). The first bridges (312c-1, 312c-3, and 312c-5) are disposed parallel to the first connector 312a, and the second bridges (312c-2 and 312c-4) are disposed to be vertical to the first bridges (312c-1, 312c-3, and 312c-5). The length (e.g., L1) of the first bridges (312c-1, 312c-3, and 312c-5) is formed to be greater than the length (e.g., M1) of the second bridges (312c-2 and 312c-4). The plurality of second bridges may form a predetermined angle with the first bridges, in which the predetermined angle is 90 degrees or not 90 degrees. For example, one first bridge may form an angle smaller than 90 degrees with one second bridge, then this second bridge may form an angle larger than 90 degrees with the next first bridge.

The first bridges (312c-1, 312c-3, and 312c-5) and the second bridges (312c-2 and 312c-4) are alternately connected. When the first bridges (312c-1, 312c-3, and 312c-5) and the second bridges (312c-2 and 312c-4) are alternately connected, as shown in FIG. 5, the extension 312c may be disposed in a shape formed by rotating the letter S by 90 degrees. That is, the first bridge (312c-1), the second bridge (312c-2), the first bridge (312c-3), the second bridge (312c-4), and the first bridge (312c-5) are sequentially arranged so they may be disposed according to the above-noted shape.

The first bridge (312c-1) is connected to the first connector 312a and is disposed along the same direction as the first connector 312a. As such, the second connection wire 312 has a section extending to the display panel 100 from the pad (P) and going backward in the extension 312c. Here, the backward section represents a section extended to the display panel 100 from the pad (P) in the second direction on the second connection wire 312, in which the connection wire 312 is extended to the display panel 100 in a forward direction, bent and extended toward the pad (P) in a backward direction in the backward section, and the bent and extended to the display panel 100. The connection wire 312 is bent at least twice, and the wire is bent toward backward direction at least once.

The extension 311c of the first connection wire 311 and the extension 312c of the second connection wire 312 may be formed to be rotated by 180 degrees and to be symmetrical with each other. When the extension 311c of the first connection wire 311 is rotated by 180 degrees with respect to a virtual line (I1) passing through the centers of the extension 311c and 312c in the first direction, it may become the same shape as the extension 312c of the second connection wire 312.

Figure 6:
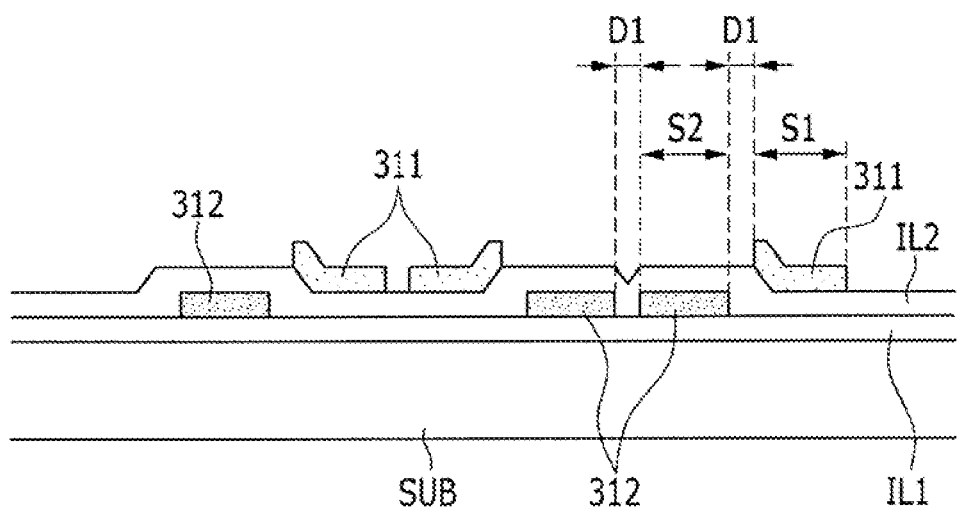
FIG. 6 shows a cross-sectional view with respect to line VI-VI of FIG. 4 according to an exemplary embodiment of the inventive concept.

The neighboring first and second connection wires 311 and 312 from among a plurality of connection wires 300 are separated and disposed with a predetermined gap D1 to form the above-noted shape. That is, as shown in FIG. 4 and FIG. 6, the two first and second connection wires 311 and 312 are extended and formed with a constant gap D1 therebetween, For example, the first bridges (311c-1, 311c-3, and 311c-5) of the neighboring first connection wire 311 are disposed separately from the second bridges (312c-1, 312c-3, and 312c-5) of the second connection wire 312 with a constant gap D1. The second bridges (311c-2 and 311c-4) of the neighboring first connection wire 311 are disposed separately from the second bridges (312c-2 and 312c-4) of the second connection wire 312 with the constant gap D1.

According to the first exemplary embodiment of the inventive concept, it is easy to increase the length of the wire within a predetermined width since the first and second connection wires 311 and 312 include the section going backward in the second direction. As shown in FIG. 4 and FIG. 5, the first and second connection wires 311 and 312 include the section going backward in the second direction so resistance of the connection wire may be increased without deteriorating integrity of the connection wire.

Referring to FIG. 6, the first and second connection wires 311 and 312 are formed on different layers. The first connection wire 311 and the second connection wire 312 are sequentially stacked on the substrate (SUB). An insulating layer IL2 may be provided between the first and second connection wires 311 and 312.

The first connection wire 311 may be formed on the same layer as the first gate wire GW1 of the display panel 100. The second connection wire 312 may be formed on the same layer as the second gate wire GW2 of the display panel 100.

When the first and second connection wires 311 and 312 are formed on a single layer and the gap D1 between the first and second connection wires 311 and 312 is reduced, the possibility of short-circuiting the first and second connection wires 311 and 312 is increased. An etching process has a limit in reducing the gap D1 between the first and second connection wires 311 and 312. However, according to the first exemplary embodiment of the inventive concept, the gap D1 between the first and second connection wires 311 and 312 may be minimized by forming the first and second connection wires 311 and 312 on different layers. That is, when the gap D1 between the first and second connection wires 311 and 312 is reduced, the possibility of short-circuiting the first and second connection wires 311 and 312 is reduced.

Figure 13:
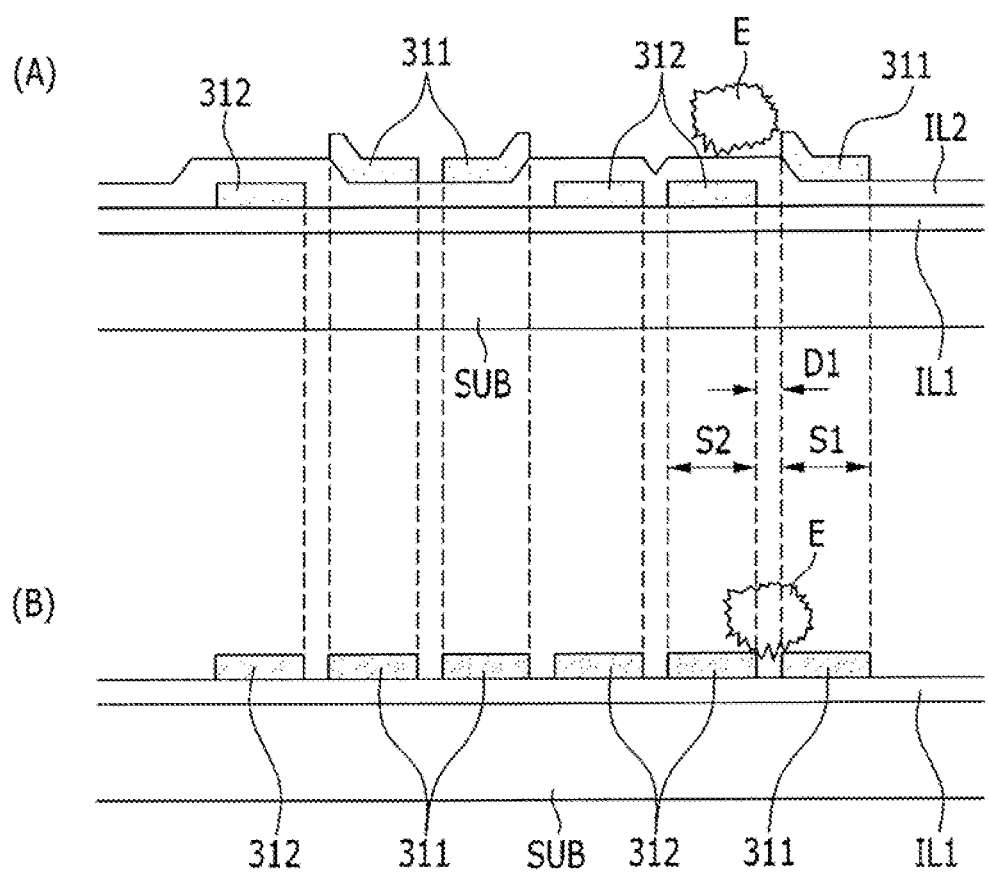
FIG. 13 shows a comparison of connection wires configured with a single layer and double layers according to an exemplary embodiment of the inventive concept.

FIG. 13 shows a comparison of connection wires configured with a single layer and double layers.

Referring to FIG. 13(A), when the first and second connection wires 311 and 312 are formed with the constant gap D1, an insulating layer is provided between the first and second connection wires 311 and 312, thus the possibility of short circuiting the first and second connection wires 311 and 312 by a foreign particle (E) is low. However, as shown in FIG. 13(B), when the first and second connection wires 311 and 312 are formed on the same layer with the same gap D1 shown in FIG. 13(A), the possibility of short circuiting the first and second connection wires 311 and 312 by a foreign particle (E) is increased.

As described, the first and second connection wires 311 and 312 are formed on different layers to prevent the first and second connection wires 311 and 312 from being short-circuited by a foreign particle, The gap D1 between the first and second connection wires 311 and 312 may be minimized so that the integrity of the connection wire may be increased. The width S1 of the first connection wire 311 may correspond to the width S2 of the second connection wire 312.

As described in the first exemplary embodiment of the inventive concept, the first and second connection wires 311 and 312 are formed as double layers, and they may be configured to be triple or quadruple layers.

Referring to FIG. 1, the pad (P) is configured with a plurality of connecting pad terminals P1 and P3 and a plurality of dummy pad terminals P2.

As described above, a plurality of connecting pad terminals P1 and P3 may be connected to a plurality of connection wires 300. That is, some of the connection wires are connected to the connecting pad terminal P1 and the rest of the connection wires are connected to the connecting pad terminal P3.

A dummy pad terminal P2 may be provided between the connecting pad terminals P1 and P3. The connection wire is not connected to the dummy pad terminal P2.

Regarding the display device according to the first exemplary embodiment of the inventive concept, the flexible film 400 is connected to the pad (P) in the peripheral area (PA). A first driving chip 200 for driving the display panel 100 may be mounted on the flexible film 400. The flexible film 400 may be a chip on film (COF).

The flexible film 400 may be generated by forming a plurality of metal wires on a flexible base film.

The first driving chip 200 may be installed on the base film and may generate a driving signal. For example, the first driving chip 200 may be a scan driving circuit for receiving a control signal and generating a scan signal or a data driving circuit for generating a data signal. That is, the gate driver 210 or the data driver 230 may be formed in the first driving chip 200.

Figure 9:
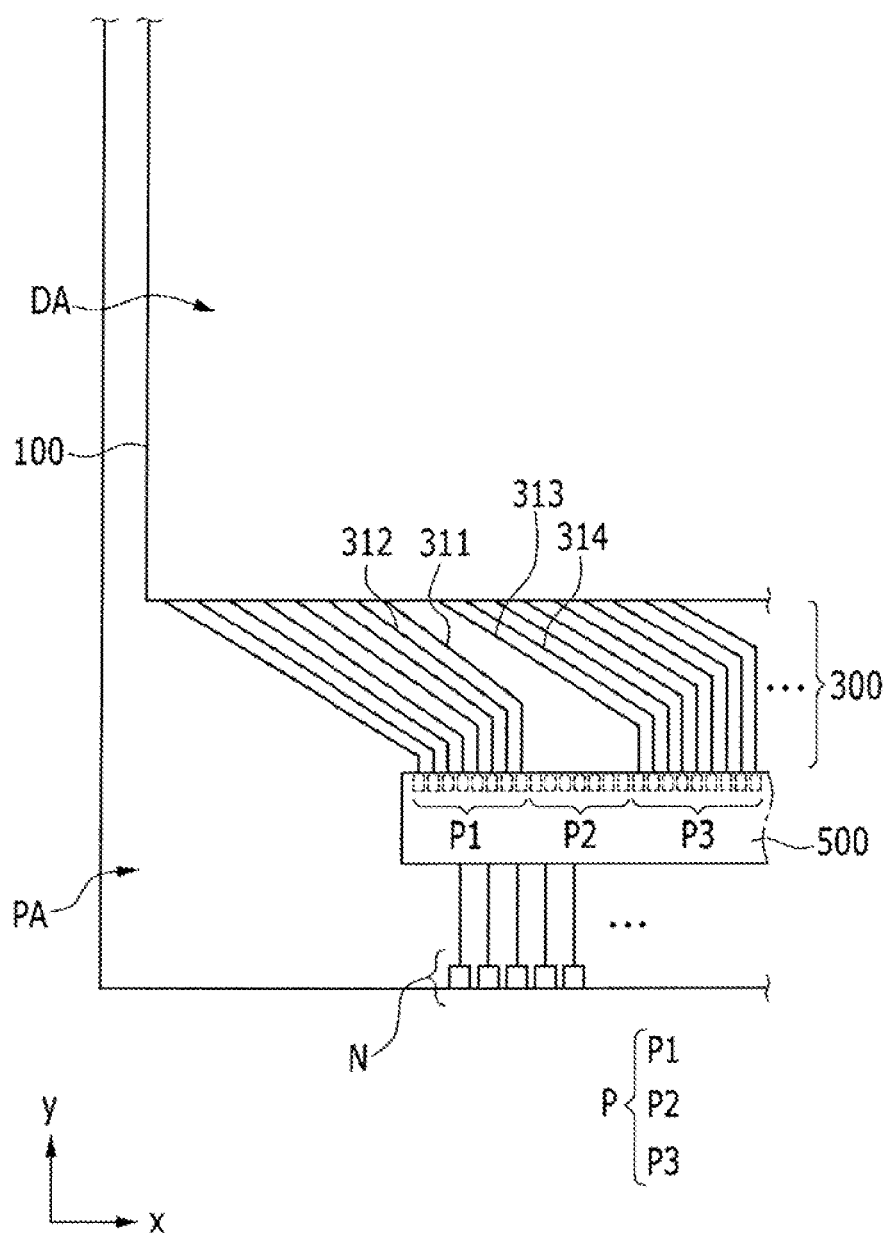
FIG. 9 shows an exemplary variation of a driving chip of FIG. 1 according to an exemplary embodiment of the inventive concept.

In the first exemplary embodiment of the inventive concept, the COF type flexible film 400 is disposed on the pad (P), moreover, as shown in FIG. 9, a chip on glass type second driving chip 500 may be disposed in the peripheral area (PA) of the substrate (SUB). A first side of the second driving chip 500 is connected to the pad (P). A second side of the second driving chip 500 may be connected to another pad (N) by an additional wire formed in the peripheral area (PA).

In a like manner as the first driving chip 200, the second driving chip 500 may be a scan driving circuit for receiving a control signal and generating a scan signal or a data driving circuit for generating a data signal. That is, the gate driver 210 or the data driver 230 may be formed in the second driving chip 500.

In an exemplary variation of the connection wire according to the first exemplary embodiment of the inventive concept, the first and second connection wires 331 and 332 are disposed such that their neighboring edges may overlap each other.

Figure 7:
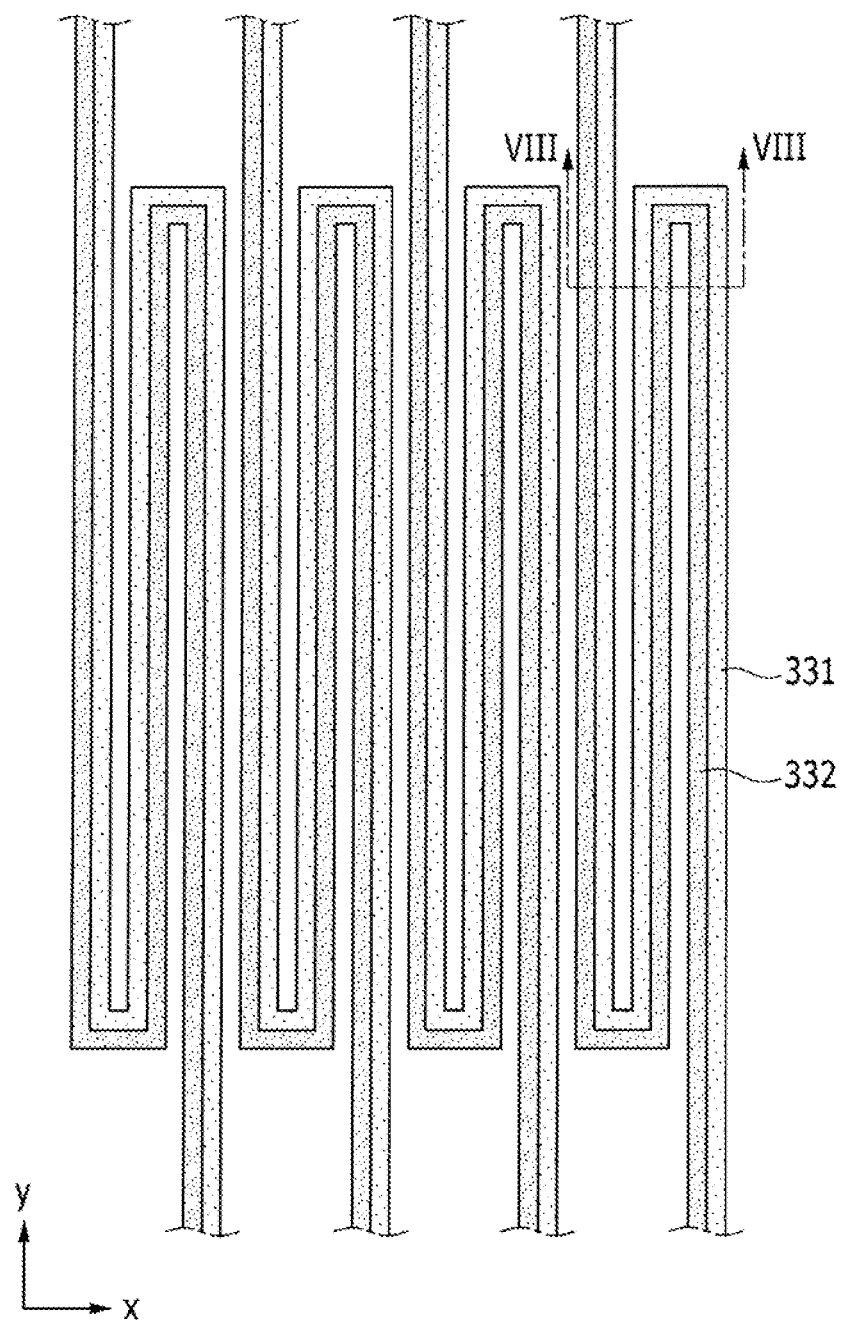
FIG. 7 shows an exemplary variation of connection wires according to a first exemplary embodiment of the inventive concept.
Figure 8:
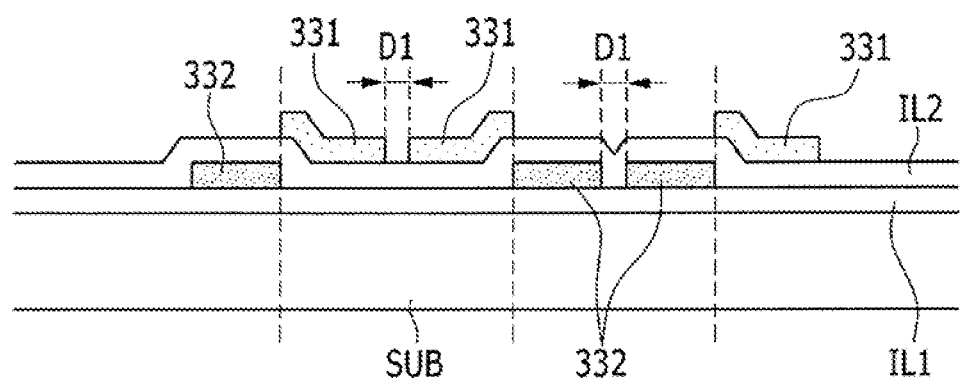
FIG. 8 shows a cross-sectional view with respect to line VIII-VIII of FIG. 7 according to an exemplary embodiment of the inventive concept.

Referring to FIG. 7 and FIG. 8, no gap is provided between the first and second connection wires 331 and 332, and the edges facing each other overlap the same. That is, the first and second connection wires 311 and 312 are separately disposed with the constant gap D1 in FIG. 4 to FIG. 6, and they may be disposed such that the gap D1 may be close to 0 in the exemplary variation shown in FIG. 7 and FIG. 8.

According to the present exemplary variation, the integrity of a plurality of connection wires 300 disposed in the peripheral area (PA) of the substrate (SUB) may be further improved. That is, the connection wires 300 may be more densely disposed by removing the gap among the connection wires 300.

A display device including connection wires according to a second exemplary embodiment of the inventive concept will now be described with reference to FIG. 10 to FIG. 12. The same detailed descriptions as the first exemplary embodiment of the inventive concept will be omitted in the second exemplary embodiment of the inventive concept.

Figure 10:
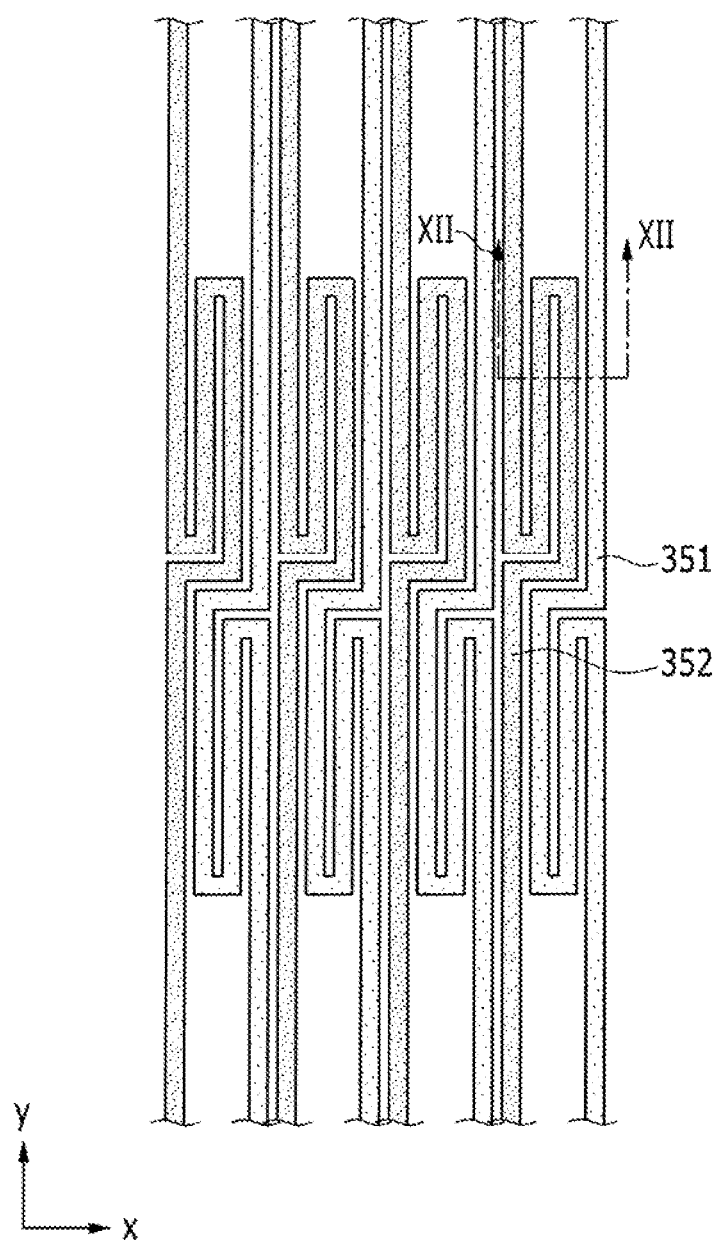
FIG. 10 shows an enlarged view of connection wires according to a second exemplary embodiment of the inventive concept.
Figure 11:
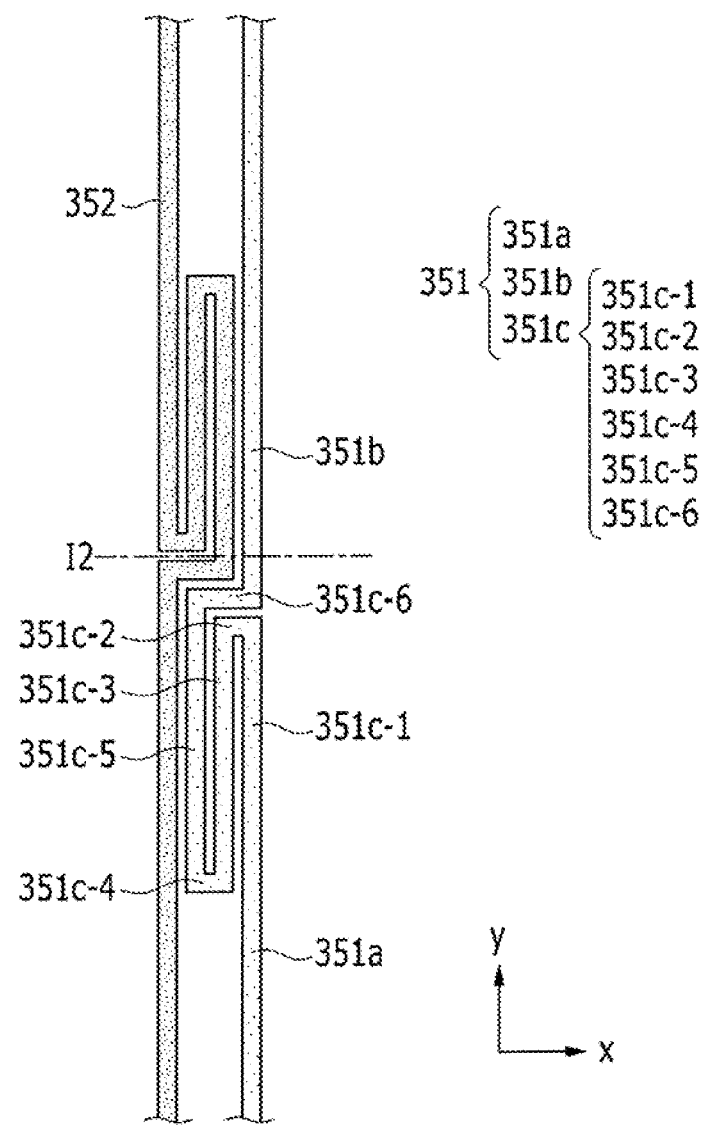
FIG. 11 shows first and second connection wires of FIG. 10 according to an exemplary embodiment of the inventive concept.
Figure 12:
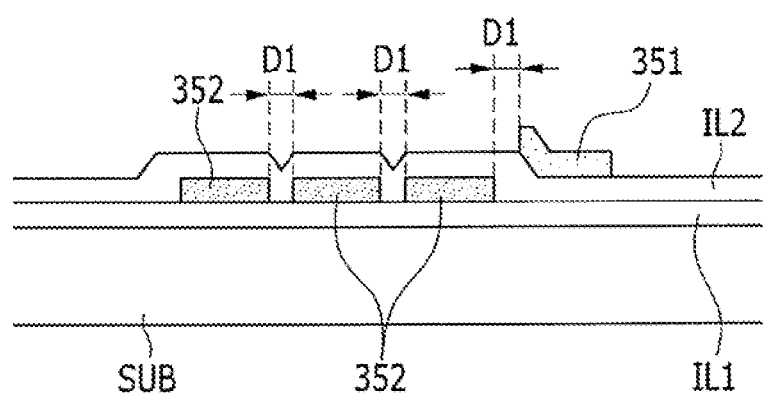
FIG. 12 shows a cross-sectional view with respect to line XII-XII of FIG. 10 according to an exemplary embodiment of the inventive concept.

FIG. 10 shows an enlarged view of a connection wire according to the second exemplary embodiment of the inventive concept, FIG. 11 shows first and second connection wires of FIG. 10, and FIG. 12 shows a cross-sectional view with respect to line XII-XII of FIG. 10.

Referring to FIG. 10 and FIG. 11, in a like manner as the first exemplary embodiment of the inventive concept, the neighboring first and second connection wires 351 and 352 from among a plurality of connection wires 300 include a section extended to the display panel 100 from the pad (P) in the second direction, in which the connection wires 351 and 352 are extended to the display panel 100 in a forward direction, bent and extended toward the pad (P) in a backward direction, and then bent and extended to the display panel 100 so as to increase the resistance of the connection wires. The connection wires 351 and 352 are bent at least twice, and these wires are bent toward backward direction at least once. For example, the connection wires may include a section formed by rotating the letter S by 90 degrees.

The extension 351c of the first connection wire 351 and the extension 352c of the second connection wire 352 may be formed to be rotated by 180 degrees and to be symmetrical with each other. When the extension 351c of the first connection wire 351 is rotated by 180 degrees with respect to a virtual line (I2) passing between the extension 351c of the first connection wire 351 and the extension 352c of the second connection wire 352 in the first direction, it may become the same shape as the extension 352c of the second connection wire 352.

Referring to FIG. 11, the first connection wire 351 includes a first connector 351a, a second connector 351b, and an extension 351c.

The first connector 351a is connected to the pad (P). The first connector 351a is extended and formed in the second direction. That is, the first connector 351a is formed to extend to the display panel 100 from the pad (P). The first connector 351a may be formed in a linear manner in the second direction.

The second connector 351b is connected to the display panel 100 and is connected to the first connector 351a through the extension 351c. The second connector 351b is formed to be bent and then connected to a signal line of the display panel 100.

The extension 351c is connected between the first and second connectors 351a and 351b to increase resistance of the first connection wire 351. The extension 351c increases the length of the connection wire to increase resistance of the wire.

The extension 351c may include a section formed by rotating the letter S by 90 degrees so as to increase the length of the connection wire, The extension 351c includes a plurality of first bridges (351c-1, 351c-3, and 351c-5) and a plurality of second bridges (351c-2, 351c-4, and 351c-6). The first bridges (351c-1, 351c-3, and 351c-5) are disposed parallel to the first connector 351a, and the second bridges (351c-2, 351c-4, and 351c-6) are disposed to be vertical to the first bridges (351c-1, 351c-3, and 351c-5). The second bridges (351c-2 and 351c-4) may be formed to have the same length. The plurality of second bridges may form a predetermined angle with the first bridges, in which the predetermined angle is 90 degrees or not 90 degrees. For example, one first bridge may form an angle smaller than 90 degrees with one second bridge, then this second bridge may form an angle larger than 90 degrees with the next first bridge.

The first bridges (351c-1, 351c-3, and 351c-5) and the second bridges (351c-2, 351c 4, and 351c-6) are alternately connected to each other. When the first bridges (351c-1, 351c-3, and 351c-5) and the second bridges (351c-2, 351c-4, and 351c-6) are alternately connected, as shown in FIG. 11, the extension 351c may be disposed in a like manner as the letter S is rotated by 90 degrees. That is, the first bridge (351c-1), the second bridge (351c-2), the first bridge (351c-3), the second bridge (351c-4), the first bridge (351c-5), and the second bridge (351c-6) are sequentially disposed so they may be disposed according to the above-noted shape.

Differing from the first exemplary embodiment of the inventive concept, the first bridge of the neighboring second connection wire 352 is not provided among the first bridges (351c-1, 351c-3, and 351c-5) of the first connection wire 351. That is, the extensions of the first and second connection wires 311 and 312 overlap each other in the first exemplary embodiment of the inventive concept, and the extensions of the first and second connection wires 351 and 352 are disposed separately from each other in the second exemplary embodiment of the inventive concept.

Referring to FIG. 12, in a like manner as the first exemplary embodiment of the inventive concept, the first and second connection wires 351 and 352 are formed on different layers. The first connection wire 351 and the second connection wire 352 are sequentially stacked on the substrate (SUB). An insulating layer IL2 may be provided between the first and second connection wires 351 and 352.

In the display device including connection wires according to an exemplary embodiment of the inventive concept, the first and second connection wires 311 and 312 are formed on different layers to prevent the first and second connection wires 311 and 312 from being short-circuited by a foreign particle, and the gap between the neighboring first and second connection wires 311 and 312 may be minimized to increase the integrity of the connection wires.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate including a display area for displaying an image and a peripheral area neighboring the display area;
    a plurality of signal lines disposed in the display area;
    a pad disposed in the peripheral area; and
    a plurality of connection wires connecting the signal lines and the pad,
    wherein
    the connection wires include a first connection wire and a second connection wire adjacent to each other,
    the first connection wire and the second connection wire are bent at least twice to have at least one being bent toward backward direction in the peripheral area,
    the first connection wire and the second connection wire each includes:
    a first connector connected to the pad and a second connector connected to the signal line; and
    an extension connected between the first and second connectors, the extension comprising a plurality of first bridges disposed parallel to the first connector and a plurality of second bridges forming a predetermined angle with the first bridges, and the first bridges and the second bridges being alternately connected, and
    wherein
    two or more first bridges of the plurality of first bridges of the first connection wire is disposed between the first connector of the second connection wire and one first bridge of the plurality of the first bridges of the first connection wire in a first direction,
    two or more first bridges of the plurality of first bridges of the second connection wire is disposed between the second connector of the first connection wire and one first bridge of the plurality of the first bridges of the second connection wire in the first direction, and
    one second bridge of the plurality of second bridges of the first connection wire and one second bridge of the plurality of second bridges of the second connection wire are disposed between the plurality of first bridges of the first connection wire and the plurality of first bridges of the second connection wire in a second direction crossing the first direction.
2. The display device of claim 1, wherein the first and second connection wires are disposed and separated from each other with a predetermined gap.
3. The display device of claim 1, wherein a first bridge, of the plurality of first bridges, and a second bridge, of the plurality of second bridges, adjacent to each other are vertical to each other.
4. The display device of claim 1, wherein the first bridges are disposed parallel to each other.
5. The display device of claim 4, wherein neighboring first bridges from among the first bridges are formed to have a same length.
6. The display device of claim 1, wherein the second bridges are disposed parallel to each other.
7. The display device of claim 6, wherein the second bridges are formed to have different lengths.
8. The display device of claim 6, wherein the second bridges are formed to have the same length.
9. The display device of claim 1, wherein the first bridges are longer than the second bridges.
10. The display device of claim 1, wherein the second connector is bent.
11. The display device of claim 1, wherein extension of the first connection wire and extension of the second connection wire neighboring the first connection wire are rotated by 180 degrees and are symmetrical with each other.
12. The display device of claim 1, wherein the pad includes:
    a plurality of connecting pad terminals connected to the connection wires; and
    a plurality of dummy pad terminals not connected to the connection wires.
13. The display device of claim 12, wherein the first and second connection wires are connected to the connecting pad terminals.
14. The display device of claim 1, further comprising: a flexible film connected to the pad and including a first side on which a first driving chip is provided.
15. The display device of claim 1, further comprising: a second driving chip formed in the peripheral area and connected to the pad.
16. The display device of claim 1, wherein an insulating layer is provided between the first and second connection wires.
17. The display device of claim 1, wherein signal lines connected to the first and second connection wires from among the signal lines are formed on different layers.
18. The display device of claim 1, wherein the connection wires are formed to be double layers, triple layers, or quadruple layers.
19. The display device of claim 1, wherein the signal lines are gate lines.
20. The display device of claim 1, wherein the signal lines are data lines.

* * * * *